(12) United States Patent
Dyer et al.

(10) Patent No.: US 7,587,660 B2
(45) Date of Patent: Sep. 8, 2009

(54) MULTIPLE-ACCESS CODE GENERATION

(75) Inventors: Justin S. Dyer, Manhattan, KS (US); Balasubramaniam Natarajan, Manhattan, KS (US)

(73) Assignee: Kansas State University Research Foundation, Manhattan, KS (US)

( * ) Notice: Subject to any disclaimer, the term of this patent is extended or adjusted under 35 U.S.C. 154(b) by 667 days.

(21) Appl. No.: 11/112,249

(22) Filed: Apr. 22, 2005

(65) Prior Publication Data

US 2006/0239371 A1    Oct. 26, 2006

(51) Int. Cl.
*H03M 13/03* (2006.01)
(52) U.S. Cl. .......................... 714/795; 714/792; 714/799
(58) Field of Classification Search ................ 714/795, 714/792, 786, 799, 779, 784, 794
See application file for complete search history.

(56) References Cited

U.S. PATENT DOCUMENTS

| | | | |
|---|---|---|---|
| 5,726,658 A | 3/1998 | Auslander | |
| 6,141,373 A * | 10/2000 | Scott | ........................... 375/150 |
| 6,185,246 B1 | 2/2001 | Gilhousen | |
| 6,512,737 B1 | 1/2003 | Agee | |
| 6,526,091 B1 | 2/2003 | Nystrom | |
| 6,639,902 B2 | 10/2003 | Mennekens | |
| 6,654,365 B1 * | 11/2003 | Sylvester et al. | ............ 370/342 |
| 6,671,251 B1 | 12/2003 | Kim | |
| 6,686,879 B2 | 2/2004 | Shattil | |
| 6,714,582 B2 | 3/2004 | Nakamura | |
| 6,741,550 B1 | 5/2004 | Shin | |
| 6,788,730 B1 | 9/2004 | Richards | |
| 6,804,216 B1 | 10/2004 | Kuwahara | |
| 6,836,505 B2 | 12/2004 | Eto | |
| 6,842,442 B2 | 1/2005 | Okawa | |
| 6,862,552 B2 | 3/2005 | Goldstein | |
| 6,912,240 B2 | 6/2005 | Kumar | |
| 6,956,891 B2 | 10/2005 | Tan | |
| 2002/0037000 A1 | 3/2002 | Park | |
| 2002/0106002 A1 | 8/2002 | Sun | |
| 2002/0122392 A1 | 9/2002 | Elezabi | |

(Continued)

FOREIGN PATENT DOCUMENTS

WO    WO 2004/057786    7/2004

OTHER PUBLICATIONS

K. H. Karkainnen, "Mean-square cross-correlation as a performance measure for spreading code families," in IEEE 2nd Int. Symp. on Spread Spectrum Techniques and Applications (ISSTA '92), 1992, pp. 147-150.

(Continued)

*Primary Examiner*—Esaw T Abraham
*Assistant Examiner*—Fritz Alphonse
(74) *Attorney, Agent, or Firm*—Steven J. Shattil (57) ABSTRACT

Multiple-access codes are generated using an asymptotically optimal decoding algorithm, such as the Viterbi algorithm. A trellis may be constructed using a number of desired users, at least one code length, and a number of code-chip parameters. A fitness function is derived from a mathematical relationship between the multiple-access codes, and may include some measure of correlation of the codes. The multiple-access codes correspond to paths having optimal path metrics derived from the fitness function. Multiple iterations through the trellis may be performed to refine a selection of multiple-access codes.

14 Claims, 4 Drawing Sheets

U.S. PATENT DOCUMENTS

| | | | |
|---|---|---|---|
| 2002/0136171 | A1 | 9/2002 | Mennekens |
| 2002/0150068 | A1 | 10/2002 | Orr |
| 2002/0186651 | A1 | 12/2002 | Nee |
| 2003/0043774 | A1 | 3/2003 | Hamalainen |
| 2003/0095590 | A1 | 5/2003 | Fuller |
| 2003/0108084 | A1 | 6/2003 | Bolourchi |
| 2003/0156562 | A1 | 8/2003 | Zeira |
| 2003/0165184 | A1 | 9/2003 | Welborn |
| 2004/0081077 | A1 | 4/2004 | Mennekens |
| 2004/0095907 | A1 | 5/2004 | Agee |
| 2004/0156427 | A1 | 8/2004 | Gilhousen |
| 2004/0243258 | A1 | 12/2004 | Shattil |
| 2005/0031044 | A1 | 2/2005 | Gesbert |
| 2005/0177530 | A1 | 8/2005 | Jin |
| 2005/0180365 | A1 | 8/2005 | Zeira |

OTHER PUBLICATIONS

I. Oppermann and B. S. Vucetic, "Complex spreading sequences with a wide range of correlation properties," IEEE Trans. Commun., vol. 45, pp. 365-375, Nov. 1997.

B. Natarajan, C. Nassar, S. Shattil, M. Michelini, and Z. Wu, "High-performance mc-cdma via carrier interferometry codes," IEEE Trans. Veh. Technol., vol. 50(6), pp. 1344-1354, Nov. 2001.

R. L. Frank, "Polyphase codes with good nonperiodic correlation properties," IEEE Trans. Inform. Theory, vol. 9, pp. 43-45, Jan. 1965.

D. C. Chu, "Polyphase codes with good periodic correlation properties," IEEE Trans. Inform. Theory, vol. 18, pp. 720-724, Jul. 1972.

R. Gold, "Optimal binary sequences for spread spectrum multiplexing," IEEE Trans. Inform. Theory, vol. 13, pp. 619-621, Oct. 1967.

K. Yang, Y. K. Kim, and P. V. Kumar, "Quasi-orthogonal sequences for code-division multiple-access systems," IEEE Trans. Inform. Theory, vol. 46, pp. 982-992, May 2003.

P. V. Kumar and O. Moreno, "Prime-phase sequences with periodic correlation properties better than binary sequences", IEEE Trans. Inform. Theory, vol. 37, pp. 603-616, May 1991.

B. J. Wysocki and T. A. Wysocki, "Orthogonal binary sequences with wide range of correlation properties," in ISCTA'01, Ambleside, U.K., Jul. 2001, pp. 483-485.

M. B. Pursley, "Performance evaluation of phase coded spread-spectrum multiple-access communication— Part 1: System analysis," IEEE Trans. Commun., vol. COM-25, pp. 795-799, Aug. 1977.

D. V. Sarwate and M. B. Pursley, "Crosscorrelation properties of pseudorandom and related sequences," Proc. IEEE, vol. 68, pp. 593-619, May 1980.

W.O.Alltop, "Complex sequences with low periodic correlations," IEEE Transactions on Information Theory, vol. IT-26, pp. 350-354, May 1980.

S.Boztas, R.Hammons, and P.V.Kumar, "4-phase sequences with near optimum correlation properties," IEEE Transactions on Information Theory, vol. 40, pp. 1101-1113, May 1992.

E.A.Geranoitis and M.B.Pursley, "Error probability for direct-sequence spread spectrum multiple access communications- Part 2: Approximations," IEEE Transactions on Communications, vol. 30, pp. 965-999, May 1982.

D.A.Van Veldhutzen, G.B.Lamont, "On measuring multiobjective evolutionary algorithm performance," Evolutionary Computation, 2000. Proceedings of the 2000 Congress on vol. 1, Jul. 16-19, 2000 pp. 204-211 vol. 1.

A. Jaszkiewicz, "Do multiple-objective metaheuristics deliver on their promises? a computational experiment on the set-covering problem," IEEE Transactions on Evolutionary Computation, vol. 7, pp. 133-143, Apr. 2003.

J. Knowles and D. Corne, "Properties of an adaptive archiving algorithm for storing nondominated vectors," IEEE Transactions on Evolutionary Computation, vol. 7, pp. 100-116, Apr. 2003.

Zitzler, L. Thiele, M. Laumanns, C. M. Fonseca, and V. G. da Fonseca, Performance assessment of multiobjective optimizers: an analysis and review,' IEEE Transactions on Evolutionary Computation, vol. 7, pp. 117-132, Apr. 2003.

E. Zitzler and L. Thiele, 'Multiobjective evolutionary algorithms: a comparative case study and the strength pareto approach,' IEEE Transactions on Evolutionary Computation, vol. 3, pp. 257-271. Nov. 1999.

M.Laumanns, E.Zitzler, L.Thiele, "A unified model for multi-objective evolutionary algorithms with elitism," Evolutionary Computation, 2000. Proceedings of the 2000 Congress on vol. 1, Jul. 16-19, 2000 pp. 46-53 vol. 1.

* cited by examiner

$u_k(n)$: $n^{th}$ element of $k^{th}$ user's code
$\Phi_m$: $m^{th}$ candidate phase

MULTIPLE-ACCESS CODE GENERATION

BACKGROUND OF THE INVENTION

I. Field of the Invention

The present invention relates generally to generating multiple-access codes, and particularly to providing an asymptotically optimal decoding algorithm for generating multiple-access codes.

II. Description of the Related Art

Code Division Multiple Access (CDMA) systems, such as direct-sequence CDMA (DS-CDMA), multi-carrier CDMA, multi-code CDMA, spread-OFDM, and other types of CDMA systems, commonly suffer from multiple-access interference (MAI). When a user is assigned multiple orthogonalizing codes, signal degradation can take the form of inter-symbol interference (ISI). MAI (and ISI) is typically reduced by selecting orthogonalizing codes having low cross-correlations. However, in order to achieve good spreading characteristics in a DS-CDMA system, it is necessary to employ sequences having a low average mean-square aperiodic autocorrelation considering non-zero lags.

In practice, decoding errors are minimized by using distinctive multiple-access codes with suitable autocorrelation and cross-correlation properties. The cross-correlation between any two codes should be low for minimal interference between multiple users in a communications system or between multiple target reflections in radar and positioning applications. At the same time, it is desirable for the autocorrelation property of a multiple-access code to be steeply peaked, with small side-lobes. Maximally peaked code auto-correlation yields optimal acquisition and synchronization properties for communications, radar and positioning applications. Unfortunately, favorable autocorrelation characteristics are typically achieved at the expense of cross-correlation characteristics, and vice versa.

Code selection typically involves a trade-off between auto-correlation and cross-correlation performance. Various code-design techniques are described in D. V. Sarwate, "Mean-square correlation of shift-register sequences," *Proc. IEEE*, vol. 131(2), April 1984, pp. 795-799, K. Yang, et. al., "Quasi-orthogonal sequences for code-division multiple-access systems," *IEEE Trans. Inform. Theory*, vol. 46, pp. 982-992, May 2003, in P. V. Kumar and O. Moreno, "Prime-phase sequences with periodic correlation properties better than binary sequences," *IEEE Trans. Inform. Theory*, vol. 37, pp. 603-616, May 1991, and in I. Oppermann and B. S. Vucetic, "Complex spreading sequences with a wide range of correlation properties," *IEEE Trans. Commun.*, vol. 45, pp. 365-375, November 1997, which are hereby incorporated by reference.

Various code-selection techniques have been developed, including artificial-intelligence approaches to complex signature sequence estimation, such as described in E. Buehler, B. Natarajan, and S. Das, "Multiobjective genetic algorithm based complex spreading code sets with a wide range of correlation properties," in *Proc. 15th International Conference on Wireless Communications*, Vol. 2, Calgary, Alberta, Canada, 2003, pp. 548-552, and in B. Natarajan, S. Das, and D. Stevens, "Design of Optimal Complex Spreading Codes for DS-CDMA Using an Evolutionary Approach," in *Proc. Global Communications Conference*, Dallas, November 2004, which are hereby incorporated by reference.

SUMMARY OF THE INVENTION

Embodiments of the invention may adapt an asymptotically optimal decoding algorithm to provide for constructing a multiple-access code set. For example, some embodiments of the invention may employ a Viterbi algorithm (such as described in A. J. Viterbi, "Error bounds for convolutional codes and an asymptotically optimal decoding algorithm", IT, Vol. 13, 1967, pp. 260-269, and in A. J. Viterbi, *CDMA: Principles of spread spectrum communication*. Reading, Mass.: Addison-Wesley Publishing Company, 1995, which are hereby incorporated by reference.)

The Viterbi algorithm is a recursive solution to the problem of estimating the state sequence of a discrete-time finite-state Markov process observed in memoryless noise. Viterbi decoding is not restricted to decoding convolutional codes, but can be applied to other sequence estimation problems such as channel equalizers. Embodiments of the present invention may configure the Viterbi algorithm (and other asymptotically optimal decoding algorithms) to design spreading codes and/or multiple-access codes having at least one predetermined attribute.

A Viterbi convolutional decoder selects a path through a trellis (i.e., a state-transition diagram) that represents the most likely sequence that was generated by a convolutional encoder. At each symbol period, the algorithm generates a branch metric, which is a measure of probability for each branch. A collection of branches through the trellis from a beginning node to an end node is typically referred to as a path. The best path of each state is then determined by examining the accumulated metrics from all paths entering the state and selecting the one with the best metric. Paths with errors accumulate lower metrics, and thus, are discarded, leaving only the path that represents the sequence most likely generated by the convolutional coder.

Embodiments of the invention provide for metrics, such as correlation metrics, that characterize one or more predetermined relationships between codes for a given code set being constructed. One embodiment of the invention employs a mean-square aperiodic cross-correlation. In another embodiment of the invention, an average mean-square autocorrelation is employed. Yet another embodiment uses a maximum aperiodic cross-correlation. Alternative embodiments of the invention may employ any of a variety of measures to evaluate correlation characteristics of the spreading sequences and/or alternative signal parameters, such as peak-to-average power.

Some embodiments of the invention may provide for multiple iterations through the trellis. For example, a first pass through the trellis may employ incomplete information about the codes if the codes are constructed during the first pass. Subsequent passes through the trellis typically employ complete code sets. Thus, branch metrics may be more complete for subsequent passes in the sense that the metrics are based on complete code sets having a full code length for each code rather than partial code lengths and/or otherwise incomplete code sets. Accordingly, method and apparatus embodiments of the invention may be configured to update or improve an existing code set with respect to at least one set of metrics. Code construction may be performed as an iterative procedure comprising multiple passes through a trellis until some predetermined criteria (e.g., a performance measure and/or a number of iterations) is achieved.

Embodiments disclosed herein may be advantageous to systems employing CDMA (e.g., cdmaOne, cdma2000, 1xRTT, cdma 1xEV-DO, cdma 1xEV-DV, and cdma2000 3x), W-CDMA, Broadband CDMA, Universal Mobile Telephone System (UMTS) and/or GPS signals. However, the invention is not intended to be limited to such systems, as other coded signals may benefit from similar advantages.

Embodiments of the invention may be employed in conjunction with multiple-access coding in multicarrier systems. For example, in Multi-Carrier (MC) CDMA spreading codes are employed for spreading each user's signals across one or more sets of sub-carrier frequencies. Thus, MC-CDMA performs spreading before serial-to-parallel (S/P) conversion and IFFT processing in an OFDM transmitter. A Spread-OFDM transmitter represents a subtle variation of MC-CDMA that uses orthogonal spreading codes for multiplexing data symbols or channels for a particular user, rather than for multiple access. Spread-OFDM typically employs at least one other multiple-access technique (e.g., OFDMA and/or TDMA) to separate users. MC-DS-CDMA performs spreading after S/P conversion, but prior to IFFT processing. This results in each sub-carrier symbol being spread in the time domain. Multi-Tone (MT) DS-CDMA performs spreading after IFFT processing, which destroys the orthogonality condition between subcarriers.

Embodiments of the invention may employ variants of CDMA and multicarrier waveforms, such as Generalized Multi-Carrier (GMC) CDMA described in G. B. Giannakis, Z. Wang, A. Scaglione, and S. Barbarossa, "AMOUR—Generalized Multicarrier Transceivers for Blind CDMA Regardless of Multipath", *IEEE* Transactions on Communications, vol. 48, no. 12, pp. 2064-2076, December 2000, which is hereby incorporated by reference. Embodiments of the invention may be employed with various code constellations, such as described in Robert L. Frank, "Polyphase Complementary Codes." *IEEE* Transactions On Information Theory, Vol. IT-26, No. 6, November 1980, pp. 641-647, and U.S. Pat. No. 6,686,879, which are hereby incorporated by reference.

The invention is not limited to particular types of communication systems. For example, embodiments of the invention may be implemented within wireless LAN, Wi-Max, satellite, optical fiber, optical free-space, and Ultra-Wideband systems. Embodiments of the invention may also be configured to operate in remote-sensing systems, such as Radars, Lidars, RF tagging, and sensor networks.

Embodiments of the invention may be configurable for generating code sets, updating code sets, and/or reassigning user codes in response to demand for network resources, changes in the number of users accessing the network, individual user-access requirements, changes in signal-propagation characteristics (e.g., multipath, Doppler, path loss, etc.), and/or interference (e.g., ISI, MAI, jamming, etc.). Embodiments of the invention may provide for flexible code lengths, support multiple levels of Quality of Service, and/or allow for system overloading. Embodiments of the invention may be optimized for minimum processing complexity, such as to enable suitability for real-time applications, rapid updates, low power consumption, and/or low cost processing components. Particular embodiments of the invention may be configured to provide for the previously recited features and advantages and/or alternative features and advantages.

These and other embodiments of the invention are described with respect to the figures and the following description of the preferred embodiments.

DESCRIPTION OF PREFERRED EMBODIMENTS

While the invention is susceptible to various modifications and alternative forms, specific embodiments thereof have been shown by way of example in the drawings and are herein described in detail. It should be understood, however, that it is not intended to limit the invention to the particular form disclosed, but rather, the invention is to cover all modifications, equivalents, and alternatives falling within the spirit and scope of the invention as defined by the claims.

Figure 1A:
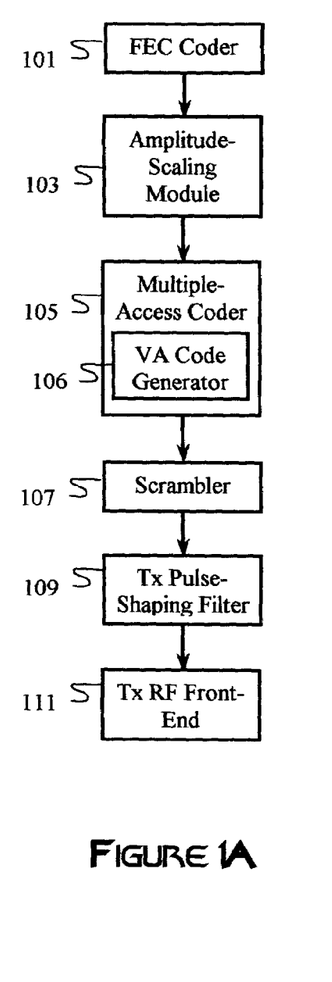
FIG. 1A shows a block diagram of a CDMA transmitter in accordance with an exemplary embodiment of the invention.

FIG. 1A shows a block diagram of a CDMA base station transmitter in accordance with an exemplary embodiment of the invention. A forward-error-control (FEC) coder 101 is configurable to provide channel coding (e.g., convolutional coding, block error-correction coding, etc.) to a plurality of user data streams. An optional amplitude-scaling module 103 may be configured to scale individual user data streams in accordance with transmit-power requirements for servicing individual users at different locations in the base station's coverage area.

A multiple-access coder 105 spreads each user's data sequence with a user-specific multiple-access code. The multiple-access coder comprises a Viterbi Algorithm code generator 106 configured to produce multiple-access code sets. Various terms are commonly used to describe multiple-access coding. In W-CDMA, multiple-access coding is referred to as "spreading" with orthogonal variable spreading factor (OVSF) codes. Alternatively, CDMA2000 and IS-95 employ Walsh covering codes for multiple-access coding, or "covering." Thus, embodiments of the present invention may be configured to process any of various types of CDMA signals, including W-CDMA, CDMA2000, and IS-95 signals.

A scrambler 107 is used to scramble one or more user data streams output by the multiple-access coder 105. The scrambler 107 typically scrambles pilot and/or control channels (i.e., common channels), which are combined with the scrambled user data streams (i.e., traffic channels). Control channels are typically employed for relaying system-control information (such as multiple-access code assignments, acknowledgement of received signals, power control, etc.) to subscriber terminals in a cellular system. A transmit pulse-shaping filter 109 up-samples and shapes the combined signal, such as is well-known in the art, and outputs a pulse-shaped signal to an RF front-end 111 that couples an up-converted signal into a communication channel.

The multiple-access interference (MAI) experienced by a particular user is often caused by the multipath channel, which destroys the orthogonality of the user signals. Another source of interference includes users employing non-orthogonal or quasi-orthogonal codes in the same cell or in adjacent cells. Although equalization may be helpful in reducing some of the MAI, a preferable way to reduce MAI is to select codes having low cross correlation. Some embodiments of the invention may employ channel estimation and/or channel compensation as part of a process of code selection. Embodiments of the invention may also include coordination with equalization and/or pre-equalization processes to help further reduce MAI.

Although the transmitter illustrated in FIG. 1A was described with respect to a base-station system, one of ordinary skill in the art should appreciate that this exemplary embodiment may be adapted to a subscriber terminal or handset. For example, a subscriber terminal may first determine which multiple-access codes are currently active (i.e., being used by other users) and then select a multiple-access code that has low correlation with the active codes. Furthermore, embodiments of the present invention may be configurable to multi-code CDMA systems in which one or more users are each assigned a plurality of multiple-access codes.

Figure 1B:
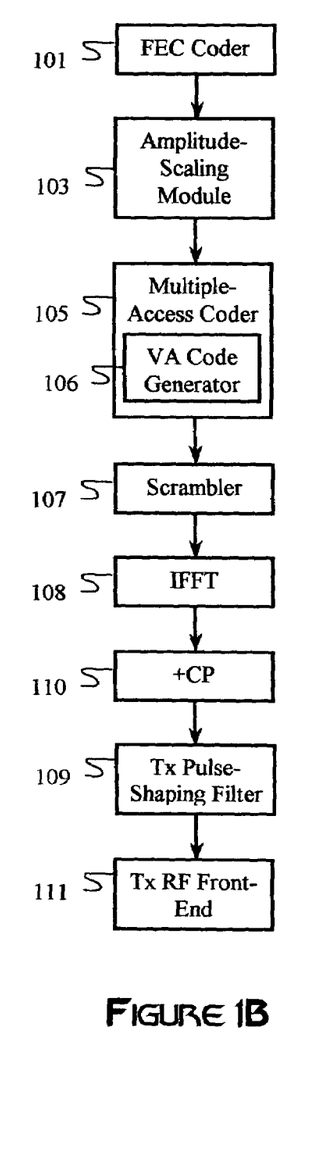
FIG. 1B shows a block diagram of an MC-CDMA transmitter in accordance with an exemplary embodiment of the invention.

FIG. 1B shows a block diagram of a multicarrier transmitter in accordance with an alternative embodiment of the invention. In this case, multiple-access codes are spread across OFDM sub-carrier frequencies. The multicarrier transmitter may be a base-station transmitter or a subscriber-terminal transmitter. The transmitter includes similar components shown in FIG. 1A, as indicated by common labels and numerals.

The multiple-access coder 105 and the scrambler 107 (which may be optional in alternative embodiments) produce a composite code, which comprises an orthogonal multiple-access code specific to each user and a base-station specific scrambling code. Coded data sequences from multiple users may be combined and then processed by an inverse fast Fourier transform (IFFT) 108 to produce a time-domain baseband transmission signal. Transmit redundancy (e.g., a cyclic prefix or guard interval) 110 may be added to the time-domain baseband transmission signal to compensate for time-dispersive channel effects due to multipath propagation.

A mobile terminal of interest typically performs operations that are substantially adjoint to the operations performed at the transmitter side. A received signal is down-converted and optionally provided with equalization to compensate for channel effects. A receiver pulse-shaping filter may be provided such that the combined effect of the receiver pulse-shaping filter and a transmit pulse-shaping filter is substantially an identity operation. Any transmit redundancy is removed and an FFT operation is performed. The FFT output is despread with a complex-conjugate composite code sequence or multiple-access code sequence corresponding to at least one desired user and/or channel. Equalization may optionally follow despreading. Equalizer filters may be provided for jointly equalizing and decoding the received signal.

Figure 1C:
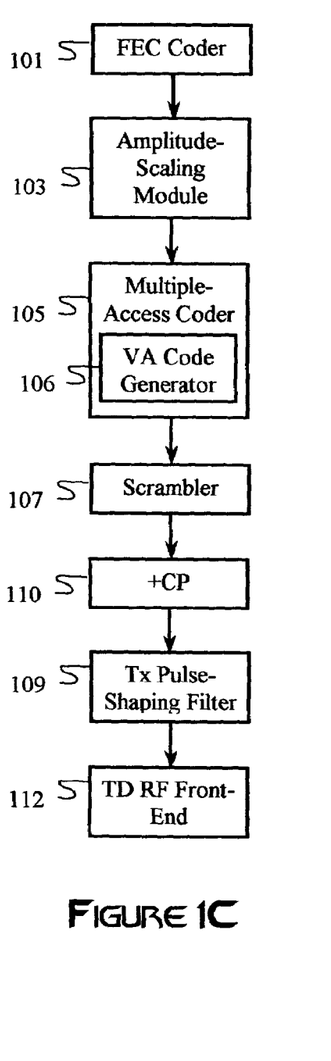
FIG. 1C is a block diagram of a transmit-diversity system or a MIMO system according to another embodiment of the invention.

FIG. 1C is a block diagram of a transmit-diversity system or a MIMO system, in which a data-symbol sequence may be converted into symbol blocks that are spread with a multiple-access composite code to produce a baseband transmission signal representing a traffic channel. The composite code includes a user-specific (or channel-specific) orthogonal multiple-access code and optionally, a base-station specific scrambling code. Typically, the orthogonal multiple-access code and the scrambling code are multiplied together. A pilot sequence may be added to the traffic channel to produce a signal that is also a baseband transmission signal. The baseband transmission signal may optionally be padded with a zero prefix and/or postfix, or a cyclic prefix and/or postfix, parallel-to-serial converted and sent to a transmit-diversity (TD) RF front-end 112.

Figure 2:
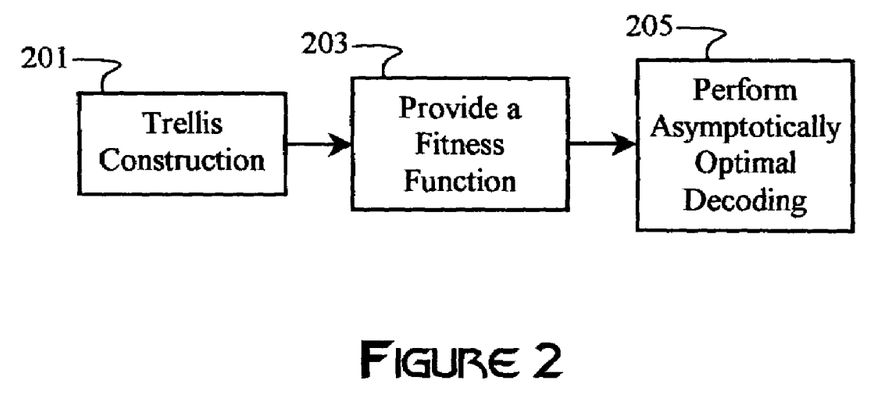
FIG. 2 illustrates an exemplary method embodiment of the invention configured for multiple-access code generation.

FIG. 2 illustrates an exemplary method embodiment of the invention configured for multiple-access code generation. Embodiments of the invention may employ various types of asymptotically optimal decoding algorithms, which are well-known in the art, including variations of the algorithm disclosed by Viterbi in "Error bounds for convolutional codes and an asymptotically optimal decoding algorithm", IT, Vol. 13, 1967, pp. 260-269. In the prior art, Viterbi's algorithm is implemented as a maximum likelihood estimation, which provides an optimization with respect to an error-measurement metric (e.g., bit-error rate). However, embodiments of the invention may employ a Viterbi-algorithm type of a maximum likelihood algorithm 205 to provide an estimate of one or more multiple-access codes based on a corresponding preferred path metric. This estimation may be weighted if necessary.

Trellis construction 201 is performed for a predetermined number K of desired users (and/or user channels, such as in the case of spread-OFDM or multi-code CDMA), at least one predetermined code length N, and a number L of code-chip signal parameters. The code-chip signal parameters may include any combination of signal phase, signal amplitude, or any other measurable signal parameter that may be employed for multiple access. Exemplary embodiments of the invention are described in J. S. Dyer and B. Natarajan, "A Low-Complexity Deterministic Algorithm for DS-CDMA Sequence Generation," to be published in VTC Fall 2005, on Sep. 25-28, 2005, and J. S. Dyer and B. Natarajan, "A New Deterministic Algorithm for DS-CDMA Signature Sequence Generation," to be published in ICC 2005, on May 16-20, 2005, which are hereby incorporated by reference.

Figure 3:
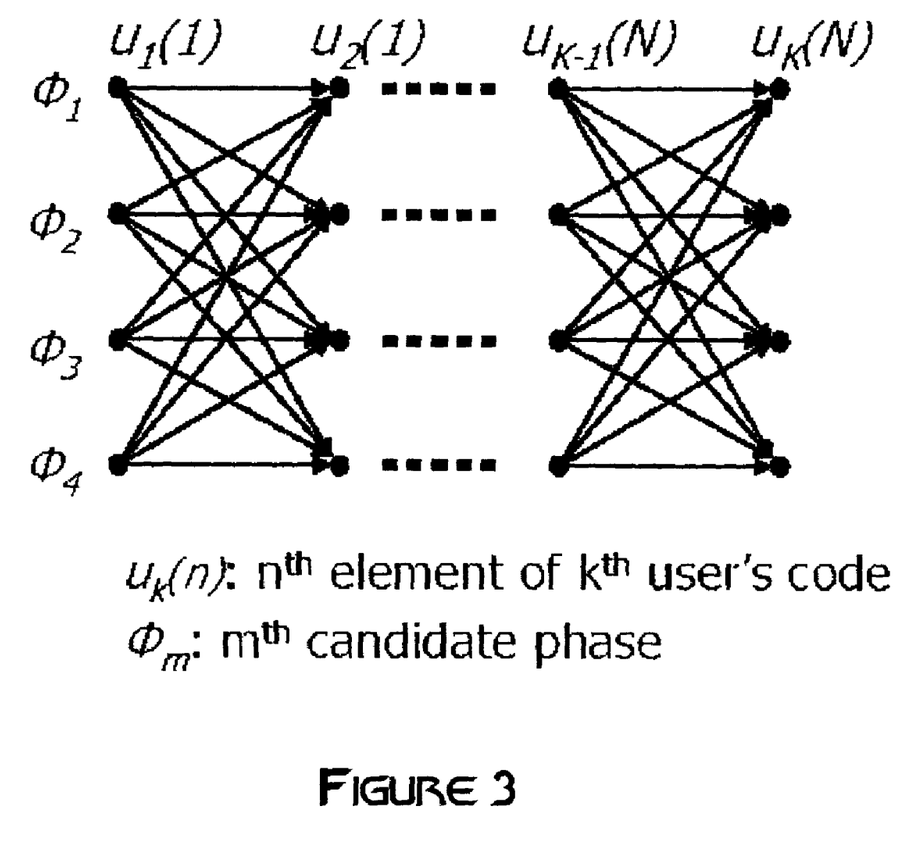
FIG. 3 is a trellis diagram in accordance with an exemplary embodiment of the invention.

In one embodiment of the invention, a trellis having K×N state transitions (such as illustrated in FIG. 3) is constructed based on the number of desired users or codes K in the system, the desired code length N, and a number L of discrete (unique) phases $\phi_1, \ldots, \phi_L$ to be used in the code set. One of ordinary skill in the art will appreciate that a trellis can be regarded as a representation of computational procedures performed by a signal-processing module comprising a combination of hardware and software components. Thus, trellis parameters and other characteristics may be embodied within algorithms, computational processes, and even hardware employed by the present invention.

The trellis includes K×N state transitions wherein each transition point is characterized by L nodes, or states. Each transition point may correspond to a particular element (i.e., code chip) for a given code set. For example, a sequence of transition points in a lattice may correspond to elements of a particular code set having the following order $$\{u_1(1), u_2(1), \ldots, u_{K-1}(N), u_K(N)\}$$

where $u_k(n)$ corresponds an $n^{th}$ element of a $k^{th}$ user's code. This topology may be classified as a by-element variant since a code-chip value is assigned to the $n^{th}$ element of each $k^{th}$ user's code before proceeding to the $(n+1)^{th}$ element.

In an alternative embodiment of the invention, the trellis may be constructed with a code set ordered as $$\{u_1(1), u_1(2), \ldots, u_K(N-1), u_K(N)\}$$

This variant will be referred to as the by-user variant, since an entire user's code is assigned before proceeding to the assignment of elements of the next user's code. In general, these two variants may provide slightly different final code sets that have similar cross-correlation characteristics.

The scope of the invention should not be interpreted as being limited to the type of ordering illustrated in the embodiments. Rather, the Applicants anticipate that alternative code-set orderings may be implemented, and that such orderings fall within the scope and spirit of the invention.

Interconnects may be made between each of the L nodes (e.g., nodes $\phi_1, \ldots, \phi_4$) at a transition point p to each of the L nodes of an adjacent transition point p+1. Although the illustrated trellis suggests that an equal number L of nodes exists for each transition point and that each node has L possible interconnects, it should be appreciated that the number of nodes L and the number of possible interconnects may differ between embodiments. For example, certain embodiments of the invention may provide for reducing the number of possible interconnects. Some embodiments of the invention may also vary the number of nodes L in the lattice.

The L nodes correspond to L candidate code-chip values, or elements, $v_l$, where $l \in \{1, \ldots, L\}$. In one exemplary embodiment of the invention, polyphase code-chip values $\phi_1, \ldots, \phi_L$ may be employed. Thus, the candidate code-chip values $v_l = \phi_l$ may be expressed as $$\phi_l = \exp\left(\frac{2\pi l}{L}\right).$$

In alternative embodiments of the invention, alternative selections of phases $\phi_1, \ldots, \phi_L$ may be employed. For example, non-uniformly spaced phase elements may be used. Although the exemplary code-chip values illustrated herein represent constant-modulus codes, embodiments of the invention may provide for complex-valued codes that include a non-uniform amplitude component. Code-chip values employed herein may alternatively comprise only a variable-amplitude component. Further variations of the invention may provide for different code-chip constellations for different transition points. For example, phase-rotated sets of complex code-chip values may be provided relative to each transition point.

In yet another embodiment of the invention, a predetermined set of candidate code chips may be weighted with a complex channel-scaling factor. For example, if multiple-access coding is to be provided across a plurality of subchannels of a multicarrier signal, the channel-scaling factor may comprise a vector of measured flat fades corresponding to each subchannel. Alternatively, channel-scaling factors may be provided for direct-sequence systems. Scaling factors may employ any of well-known channel pre-coding techniques.

For each node at a transition point in the trellis, a path terminating at one of the nodes of the previous transition point is selected based on a predetermined fitness function 203. In one exemplary embodiment, the fitness function may comprise an average mean-square aperiodic cross correlation $R_{CC}$ of the codes. However, alternative correlation functions (as well as other fitness functions) may be employed. For example, a spectral correlation function may be employed for an MC-CDMA system. An aperiodic autocorrelation may be used for reducing peak-to-average-power ratio (PAPR). Alternatively, the fitness function may use a Fourier transform of an aperiodic autocorrelation to shape the code's power spectral density, which may be advantageous for interference and jammer avoidance.

The average mean-square cross correlation $R_{CC}$ described mathematically as $$R_{CC} = \frac{1}{K(K-1)N^2} \sum_{x=1}^{K} \sum_{\substack{y=1,\\y\neq x}}^{K} \sum_{l=1-N}^{N-1} |C_{xy}(l)|^2$$

where K is the number of codes in the code set, and $C_{xy}(l)$ is the aperiodic correlation function between two codes corresponding to a lag of l. The term $C_{xy}(l)$ is expressed by $$C_{xy}(l) = \begin{cases} \sum_{k=0}^{N-1-l} u_x(k)u_y^*(k+l) & 0 \le l \le N-1 \\ \sum_{k=0}^{N-1+l} u_x(k-l)u_y^*(k) & 1-N \le l \le 0 \\ 0 & \text{otherwise} \end{cases}$$

where $u_x$ and $u_y$ represent multiple-access codes for a user x and a user y, respectively. It is customary to normalize $R_{CC}$ relative to code length to facilitate comparisons between codes of different lengths.

A mean-square measure for autocorrelation is given by $$R_{AC} = \frac{1}{KN^2} \sum_{x=1}^{K} \sum_{\substack{l=1-N,\\l\neq 0}}^{N-1} |C_{xx}(l)|^2$$

A relationship between $R_{CC}$ and $R_{AC}$ is given as follows:

$$R_{AC} \ge (K-1)(1-R_{CC})$$

Thus, the maximum-square aperiodic cross-correlation profile may be represented as the maximum value of the cross-correlations between signature sequences of any two users at some relative offset $$R_{max}(l) = \max(|C_{xy}(l)|^2) \forall x,y \in \{1, \ldots, K\},$$

which is defined for all relative delays l. An absolute maximum-square aperiodic cross correlation $R_{Max}$ is defined as the maximum value of $R_{max}(l)$ over all l. Thus, $R_{Max}$ represents a worst-case BER than can occur due to MAI.

Some embodiments of the invention may be configured to produce code sets characterized by a predetermined relationship between $R_{Max}$, $R_{AC}$, and $R_{CC}$. For example, since it may be impossible to achieve low $R_{AC}$ and $R_{CC}$ simultaneously, a trade-off may be made for selecting a code set having an optimal combination of $R_{AC}$ and $R_{CC}$. Similarly, it is desirable to have a low value of $R_{Max}$. In one preferred embodiment, the expression for $R_{CC}$ is employed as the fitness function. In another embodiment, a target value $R_{target}$ is employed wherein the fitness function is expressed by $(R_{target} - R_{CC})^2$.

In an exemplary embodiment of the invention, each node at a transition point p may be joined to a path terminating at one of the nodes of the previous transition point (p−1). Selection of a "winning" path is performed by appending the code-chip value corresponding to the particular node at transition point p to a code sequence corresponding to a path terminating at transition point p−1 based on the predetermined fitness function. A candidate path ending at transition point p−1 may be selected more than once by nodes at point p. Accordingly, one or more candidate paths at point p−1 may not be selected, and thus, can be removed from consideration. Thus, for each transition point, there are L active paths. Some embodiments of the invention may be configured to provide an approximation to the fitness function, such as by employing only a portion of the total K×N code-set matrix.

Various embodiments of the invention may provide for different decision mechanisms, such as when more than one candidate path in the trellis achieves the same minimum value of $R_{CC}$ for the current node under consideration. Typically, the decision rule in convolutional decoding and MLSE reception has been to follow a pre-defined convention, such as selecting the first path encountered with the minimum value of the error function. However, certain embodiments of the invention may have many instances in which multiple paths achieve the same $R_{CC}$ at a particular node. In these cases, employing a typical prior-art decision rule may substantially limit the code-set search space. Accordingly, embodiments of the invention may implement a deterministic decision rule. For example, the decision rule may be configured to select a path from the set of all paths having the minimum $R_{CC}$ value such that:

$$p=(k+n+l+i) \mod T$$

where p is the selected index among the set of paths having the minimum $R_{CC}$, k is the user associated with the particular code-set element we are currently evaluating, n is the index into the code for the code-set element currently under consideration, l is the index of the candidate phase, i is the number of iterations through the trellis at the present time, and T is the number of elements in the set of paths reaching the minimum $R_{CC}$. This exemplary decision rule can step sequentially through the paths with respect to indices k, n, l, and i. Thus, if for a particular k, n, and l, there are the same number of elements in the set of minimum-$R_{CC}$ paths from one iteration to the next, the algorithm will step through them sequentially over each iteration, giving each path the opportunity to be selected. This same property exists for each of the other three parameters as well, thus, introducing the needed diversity while also being deterministic and, therefore, repeatable over independent executions of the algorithm.

Figure 4:
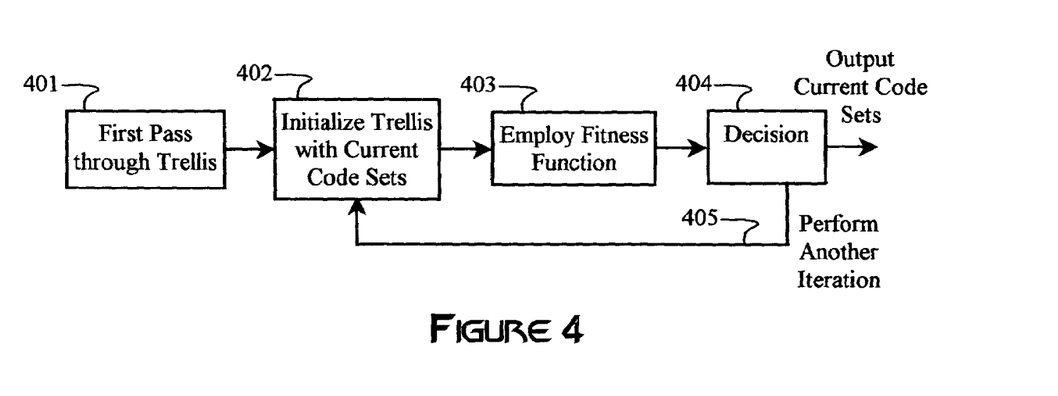
FIG. 4 illustrates a method embodiment of the invention employing multiple iterations through a trellis.

FIG. 4 illustrates a method embodiment of the invention employing multiple iterations through a trellis. Embodiments of the invention may employ iterative decoding techniques (such as described in Q. Wang and L. Wei, "Graph-Based Iterative Decoding Algorithms for Parity-Concatenated Trellis Codes,"*IEEE* Trans. Information Theory, Volume: 47 Issue: 3, Mar. 2001 Page(s): 1062-1074, which is hereby incorporated by reference) for generating multiple-access codes.

In a first pass through the trellis 401, the first N−1 elements (i.e., code chips) of each user's code may be selected based on incomplete information because the calculation of the fitness function does not employ subsequent code-chip values that are determined later. Thus, an optimal path may not be selected during the first pass. One embodiment of the invention may be configured to compensate for this problem by providing for multiple iterations (i.e., traversals) through the trellis. When the first pass 401 through the trellis is completed, L complete candidate code sets have been built. The trellis is initialized 402 with the current code sets, which are then used in the fitness function 403. The fitness function 403 is used to calculate branch metrics. Thus, the implementation of the fitness function for the first N−1 elements of each user's code set can exploit the full code-set length N.

Each subsequent iteration 405 through the trellis causes the fitness function to asymptotically approach an optimal (e.g., minimum) value. Typically, a saturation point is reached after a certain number of iterations. A decision process 404 may be provided for determining whether to repeat the trellis operations 402 and 403 or output the current code sets. Such determinations are typically made with respect to an evaluation of the metrics and/or a count of the number of iterations performed.

Viterbi decoding can be broken down into two major operations, metric update and traceback. In metric update, an accumulated state metric is calculated for each state and the optimal incoming path associated with each state is determined. Traceback uses this information to derive an optimal path through the trellis.

Some embodiments of the invention may employ multi-objective versions of an asymptotically optimal decoding algorithm. In one embodiment, metrics used to evaluate the multiple objectives may be combined into a single metric. For example, if it is desirable to evaluate two objectives f(U) and g(U), where U denotes the code matrix. A combined objective function h(f(U); g(U)) may be used to evaluate each node of the trellis.

An alternative embodiment may be based on Pareto optima. The Pareto optima are the subset of a population for which no other individual element in the population has superior characteristics in all objectives under consideration. The first iteration is completed 401 in order to provide a complete code set U for initializing the trellis 402. At each stage or node of the trellis, the fitness function 403 involves deterministically selecting one of the objectives as the evaluation metric for that stage or node, respectively. An optimal path under the chosen metric is selected at each node as part of the decision process 404.

The decision process 404 may maintain a table of the Pareto optima by considering each of the objectives at a particular node, and if one is found that belongs to the set of Pareto optima, it is added to the table of Pareto optima. Thus, the decision process 404 may include comparing the metrics of each candidate path to those of each element of the Pareto optima. If a particular element of the Pareto optima is better in every metric than the candidate path, then the candidate path is discarded because it can not belong to the set of Pareto optima. If none of the Pareto optima elements dominates a candidate path, then the candidate path is added to the table. Any elements of the current Pareto optima that are dominated by the candidate path are subsequently deleted.

Figure 5:
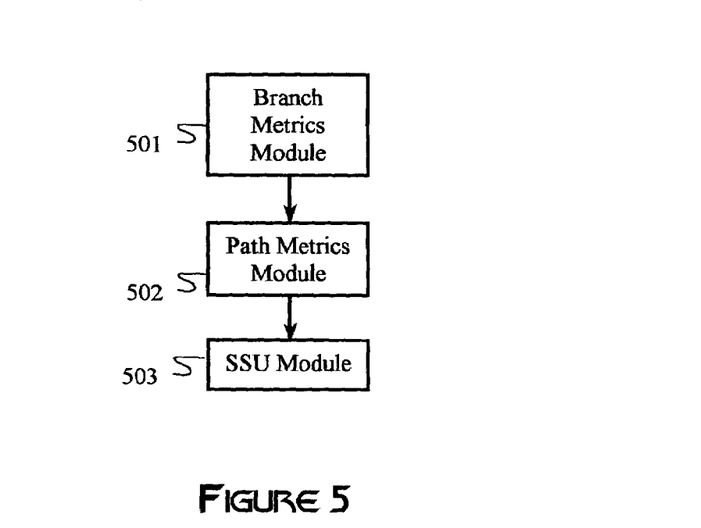
FIG. 5 shows a block diagram of a multiple-access coder according to one embodiment of the invention.

FIG. 5 shows a block diagram of a multiple-access coder according to one embodiment of the invention. A branch metrics module 501 is configured for computing a branch metric for a code-chip candidate corresponding to each of the possible transitions (i.e., code-chip values). An accumulated metrics module, or a path metrics module 502, is configured to operate at each node of the trellis to add branch metrics to one or more former path metrics, compare the new path metrics, and select at least one new optimum path metric. A survivor storage and updating (SSU) module 503 may be configured to store decisions (also called "survivors") coming from the accumulated metrics module and provide a traceback of the paths, such as is well-known in the art of Viterbi decoding.

It should be appreciated that the multiple-access coder shown in FIG. 5, as well as method embodiments of the invention, may be implemented using a variety of hardware and software. For example, portions of the multiple-access coder may be implemented using special-purpose hardware, such as an application specific integrated circuit (ASIC) and programmable logic devices such as gate arrays, and/or software or firmware running on a computing device, such as a microprocessor, microcontroller or digital signal processor (DSP). It also will be appreciated that although functions of the multiple-access coder may be integrated in a single device, such as a single ASIC, they may also be distributed among several devices.

Figure 6:
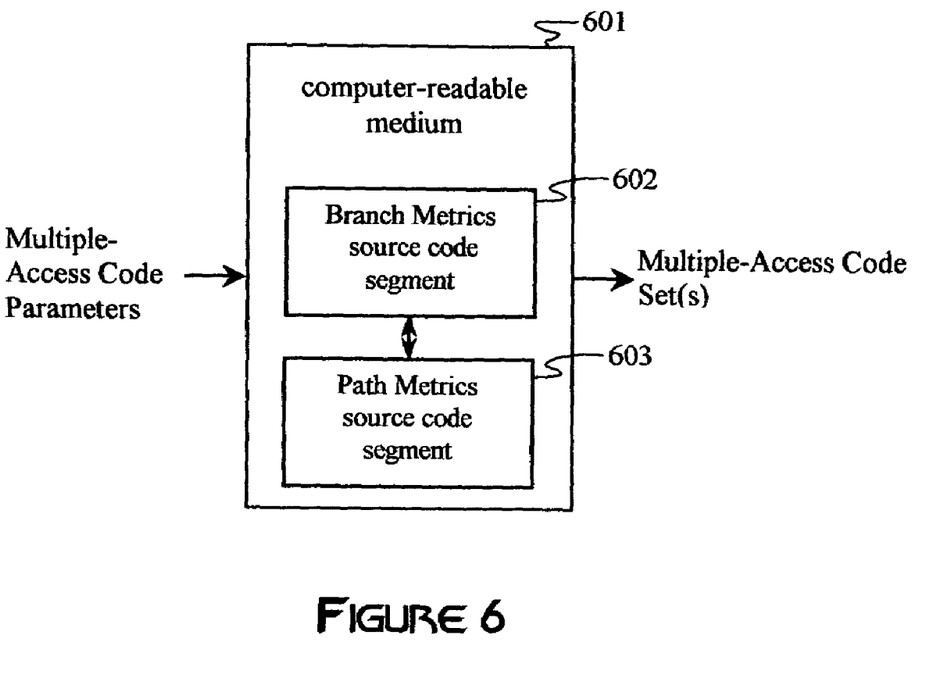
FIG. 6 illustrates software components of a multiple-access coding embodiment of the invention residing on a computer-readable memory.

FIG. 6 shows software components of a multiple-access coding embodiment of the invention residing on a computer-readable memory 601. A branch-metrics module 602 is adapted to receive as input one or more multiple-access code parameters, such as code length, number of codes and/or users, and at least one constellation of possible code-chip values. The branch-metrics module 602 is configured for calculating branch metrics for each possible state transition between two successive states. The branch-metrics module 602 may be configured to produce and/or calculate a fitness function based on an asymptotically optimal decoding algorithm (such as a Viterbi algorithm) to provide for constructing a multiple-access code set. Furthermore, the branch-metrics module 602 may construct a trellis.

A path-metrics module 603 is configured for calculating path metrics for possible paths, which result from successive state transitions. For each node in a state, the path-metrics module 603 may be further configured to select a path having an optimal path-metric value and output at least one multiple-access code set corresponding to a set of optimal paths. The branch-metrics module 602 and the path-metrics module 603 may be configured to perform multiple iterations through a trellis.

A dramatic reduction of the total algorithmic complexity can be achieved by exploiting certain properties of the trellis, as well as those of the cross-correlation operation used to compute $R_{CC}$. It is quite straightforward to see that there are $V=L^2NK$ function evaluations for each iteration through the trellis.

To calculate $R_{CC}$, it is typically necessary to perform $K(K-1)/2$ aperiodic cross correlation operations of complex-variable vectors of length N. Assuming that a Fast Fourier Transform (FFT) approach is taken to compute each of these correlations, the complexity of the function evaluation in terms of complex multiplication and additions (MADs) is $O((N \log N)K^2)$, which must be computed V times, leading to an overall complexity of $O(L^2(N^2 \log N)K^3)$.

Particular embodiments of the invention may be configured to reduce the overall complexity. For example, for each candidate phase at each stage of the trellis, a single element is appended to a single user's code and $R_{CC}$ is recalculated. This single element can be shown to affect the cross-correlation matrix in exactly N locations of each of the (K−1) cross-correlations between that user and every other user (disregarding autocorrelations). Thus, a simplification of this algorithm may involve maintaining a cross-correlation matrix $A_l$ for each candidate path through the trellis and updating the matrix $A_l$ by adding the effects of the current candidate phase at the corresponding N(K−1) locations and summing the new result to get the new value of $R_{CC}$. The simplified algorithm repeats this procedure V times, resulting in a total computational complexity of only $O(L^2N^2K^2)$.

The aperiodic cross-correlation between two users' codes, $u_x$ and $u_y$, is given by $$C_{xy}=(C_{xy}(1-N), \ldots, C_{xy}(N-1))^T$$

where $C_{yx}$ is simply the mirror image of $C_{xy}$. The $R_{CC}$ metric is based on the accumulated moduli of the aperiodic cross-correlation values at each tap delay, and for each pair of users (x, y), it is sufficient to consider only one of $C_{xy}$ and $C_{yx}$. Thus, the aperiodic cross-correlation matrix $A_l$ has a size K(K−1)/2×(2N−1), where l denotes the index of the path to which it corresponds. The matrix $A_l$ has row entries $$A_l=(C_{12}^T, C_{13}^T, \ldots, C_{1K}^T, C_{23}^T, \ldots, C_{K-1,K}^T)^T$$

such that, for every code pair (x, y), there is no corresponding pair (y, x).

Upon appending element $u_x(m)$ to a current path through the trellis, the following algorithm may be used to update the corresponding cross-correlation matrix $A_l$

---

Algorithm 1: Low-complexity $R_{cc}$ update

---

Require: $A_l$, U and new element $u_x(m)$
Ensure: one-indexing
   for $\forall_y < x$ do       $k \leftarrow (y-1)(K-1) - \dfrac{(y-1)(y-2)}{2} + (x-y)$       for p = m to m + N − 1 do
         $A_l(k_1 p) \leftarrow A_l(k_1 p) + u_y(p - m + 1)u_x^*(m)$
      end for
   end for
   for $\forall_y > x$ do       $k \leftarrow (x-1)(K-1) - \dfrac{(x-1)(x-2)}{2} + (y-x)$       for p = N − m + 1 to 2N − m do
         $A_l(k_1 p) \leftarrow A_l(k_1 p) + u_y^*(2N - m + 1 - p)u_x(m)$
      end for
   end for

---

There are two notable differences between the two for loops. The first loop uses the conjugate of the newly-appended element, $u_x(m)$, whereas the second loop uses the conjugate of the code entries from the other users' codes. Secondly, the algorithm loops through the elements of each $u_y$ in forward order in the first loop and in reverse order in the second loop. To calculate the new value for $R_{CC}$, it is necessary to subtract out the moduli of the affected elements before performing the update algorithm, and then add in the moduli of the affected elements after the algorithm is run. Thus, this full update algorithm has complexity O(NK), since there are N(K−1) elements affected in each of these operations. In contrast, conventional computational-intelligence approaches recalculate the entire $R_{CC}$ metric for each function evaluation, resulting in a complexity of $O((N \log N)K^2)$.

The invention is not intended to be limited to the preferred embodiments. Furthermore, those skilled in the art should recognize that the method and apparatus embodiments described herein may be implemented in a variety of ways, including implementations in hardware, software, firmware, or various combinations thereof. Examples of such hardware may include ASICs, Field Programmable Gate Arrays, general-purpose processors, DSPs, and/or other circuitry. Software and/or firmware implementations of the invention may be implemented via any combination of programming languages, including Java, C, C++, Matlab™, Verilog, VHDL, and/or processor specific machine and assembly languages.

Computer programs (i.e., software and/or firmware) implementing the method of this invention may be distributed to users on a distribution medium, such as a SIM card, a USB memory interface, or other computer-readable memory adapted for interfacing with a wireless terminal. Similarly, computer programs may be distributed to users via wired or wireless network interfaces. From there, they will often be copied to a hard disk or a similar intermediate storage medium. When the programs are to be run, they may be loaded either from their distribution medium or their intermediate storage medium into the execution memory of a wireless terminal, configuring an onboard digital computer system (e.g. a microprocessor) to act in accordance with the method of this invention. All these operations are well known to those skilled in the art of computer systems.

The term "computer-readable medium" encompasses distribution media, intermediate storage media, execution memory of a computer, and any other medium or device capable of storing for later reading by a digital computer system a computer program implementing the method of this invention.

Various digital computer system configurations can be employed to perform the method embodiments of this invention, and to the extent that a particular system configuration is capable of performing the method embodiments of this invention, it is equivalent to the representative system embodiments of the invention disclosed herein, and within the scope and spirit of this invention.

Once digital computer systems are programmed to perform particular functions pursuant to instructions from program software that implements the method embodiments of this invention, such digital computer systems in effect become special-purpose computers particular to the method embodiments of this invention. The techniques necessary for this programming are well known to those skilled in the art of computer systems.

Various embodiments of the invention may include variations in system configurations and the order of steps in which methods are provided. In many cases, multiple steps and/or multiple components may be consolidated.

Embodiments of the invention may be adapted for communication systems employing multiple code lengths. In an exemplary embodiment, codes having lengths $L_m$ corresponding to integer factors of a maximum code length $L_M$ may be employed. A user assigned a code of length $L_m$ may have a symbol duration equal to a fraction $L_M/L_m$ of the symbol interval corresponding to the code of length $L_M$.

The method and system embodiments described herein merely illustrate particular embodiments of the invention. It should be appreciated that those skilled in the art will be able to devise various arrangements, which, although not explicitly described or shown herein, embody the principles of the invention and are included within its spirit and scope. Furthermore, all examples and conditional language recited herein are intended to be only for pedagogical purposes to aid the reader in understanding the principles of the invention. This disclosure and its associated references are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

It should be appreciated by those skilled in the art that the block diagrams herein represent conceptual views of illustrative circuitry, algorithms, and functional steps embodying principles of the invention. Similarly, it should be appreciated that any flow charts, flow diagrams, signal diagrams, system diagrams, codes, and the like represent various processes that may be substantially represented in computer-readable medium and so executed by a computer or processor, whether or not such computer or processor is explicitly shown.

The functions of the various elements shown in the drawings, including functional blocks labeled as "processors" or "systems," may be provided through the use of dedicated hardware as well as hardware capable of executing software in association with appropriate software. When provided by a processor, the functions may be provided by a single dedicated processor, by a shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, read-only memory (ROM) for storing software, random access memory (RAM), and non-volatile storage. Other hardware, conventional and/or custom, may also be included. Similarly, the function of any component or device described herein may be carried out through the operation of program logic, through dedicated logic, through the interaction of program control and dedicated logic, or even manually, the particular technique being selectable by the implementer as more specifically understood from the context.

Any element expressed herein as a means for performing a specified function is intended to encompass any way of performing that function including, for example, a combination of circuit elements which performs that function, or software in any form, including, therefore, firmware, micro-code or the like, combined with appropriate circuitry for executing that software to perform the function. Embodiments of the invention as described herein reside in the fact that the functionalities provided by the various recited means are combined and brought together in the manner which the operational descriptions call for. Applicant regards any means that can provide those functionalities as equivalent to those shown herein.

The invention claimed is:

1. A method for generating at least one multiple-access code wherein a transmitter is configured for performing the steps of;
   constructing a trellis having;
      a plurality K×N of state transition points,
      each of the K×N state transition points including L nodes, wherein
         K is a number of multiple-access codes,
         N is a code length, and
         L is a number of a plurality of code-chip parameters;
   constructing a fitness function that is computable for each of the plurality of state transition points;
   appending at least one of the plurality of code-chip parameters to each multiple-access code corresponding to a winning path terminating at each of a plurality of nodes of a previous state transition point;
   computing the fitness function for each multiple-access code; and
   determining a winning path terminating at each node of a current state transition point.

2. The method recited in claim 1, wherein constructing the trellis includes providing for a code set ordered as a by-element variant topology or a by-user variant topology.

3. The method recited in claim 1, wherein constructing the fitness function further comprises providing for an approximation to the fitness function by employing only a portion of a total K×N code-set matrix.

4. The method recited in claim 1, wherein the plurality of code-chip parameters includes at least one of a set of code-chip parameters comprising, a plurality of phases uniformly distributed in a phase space, a plurality of non-uniformly distributed phases, and a plurality of amplitudes.

5. The method recited in claim 1, wherein constructing the fitness function includes constructing at least one of an average mean-square aperiodic cross-correlation function for a resulting code set, a maximum-square aperiodic cross-correlation for a resulting code set, a spectral correlation function, an aperiodic autocorrelation configured for reducing peak-to-average-power ratio, or a Fourier transform of an aperiodic autocorrelation.

6. The method recited in claim 1, wherein constructing the trellis includes employing a plurality of values of N.

7. The method recited in claim 1, wherein K<N, K=N, or K>N.

8. The method recited in claim 1, wherein computing the fitness function includes updating a fitness function calculated for the previous state transition point.

9. The method recited in claim 1, wherein constructing the fitness function includes providing for multi-objective versions of an asymptotically optimal decoding algorithm.

10. A digital computer system configured to perform the method recited in claim 1.

11. A computer-readable storage medium encoded with a computer program configured to perform the method recited in claim 1.

12. The method recited in claim 1, wherein computing the fitness function for each multiple-access code produces a plurality of fitness function parameters, and determining the winning path comprises processing the fitness function parameters with respect to at least one predetermined criteria, wherein the at least one predetermined criteria includes a maximum of the plurality of fitness function parameters, a minimum of the plurality of fitness function parameters, and being closest to a target fitness function parameter.

13. The method recited in claim 1, wherein an initial multiple-access code set is produced upon completing a first pass through the trellis, the method further comprising initializing the trellis with the initial multiple-access code set.

14. A multiple-access coder, comprising:
a first module configured for calculating branch metrics based on at least one fitness function for possible state transitions between two successive states; and
a second module configured for calculating, as a function of said branch metrics, path metrics for possible paths constituted by successive state transitions and ending in each of said states, wherein the second module is further configured for appending at least one of a plurality of code-chip parameters to each multiple-access code corresponding to a winning path terminating at each of a plurality of nodes of a previous state transition point, computing the fitness function for each multiple-access code, and determining a winning path terminating at each node of a current state transition point.

* * * * *